US011791272B2

(12) United States Patent
Zhou et al.

(10) Patent No.: US 11,791,272 B2
(45) Date of Patent: Oct. 17, 2023

(54) INTEGRATED CIRCUITS (ICS) WITH MULTI-ROW COLUMNAR DIE INTERCONNECTS AND IC PACKAGES INCLUDING HIGH DENSITY DIE-TO-DIE (D2D) INTERCONNECTS

(71) Applicant: QUALCOMM Incorporated, San Diego, CA (US)

(72) Inventors: Rong Zhou, San Diego, CA (US); William M. Aderholdt, Oceanside, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 122 days.

(21) Appl. No.: 17/191,557

(22) Filed: Mar. 3, 2021

(65) Prior Publication Data

US 2022/0285280 A1 Sep. 8, 2022

(51) Int. Cl.
*H01L 23/538* (2006.01)
*H01L 23/00* (2006.01)
*H01L 25/065* (2023.01)

(52) U.S. Cl.
CPC .......... *H01L 23/5386* (2013.01); *H01L 24/16* (2013.01); *H01L 24/17* (2013.01);
(Continued)

(58) Field of Classification Search
CPC . H01L 23/58; H01L 23/5381; H01L 23/5386; H01L 25/0655; H01L 2224/1712;
(Continued)

(56) References Cited

U.S. PATENT DOCUMENTS

2009/0268147 A1 10/2009 Tang et al.
2012/0068349 A1 3/2012 Kim et al.
(Continued)

OTHER PUBLICATIONS

International Search Report and Written Opinion for International Patent Application No. PCT/US2022/070496, dated Aug. 30, 2022, 21 pages.

*Primary Examiner* — Victor A Mandala
*Assistant Examiner* — Lawrence C Tynes, Jr.
(74) *Attorney, Agent, or Firm* — Withrow & Terranova, PLLC

(57) ABSTRACT

An integrated circuit (IC) package including ICs with multi-row columnar die interconnects has increased die-to-die (D2D) interconnect density in a conductive layer. Positioning the die interconnects in die interconnect column clusters, that each include a plurality of die interconnect rows and two columns, reduces the linear dimension occupied by the die interconnects and leaves room for more D2D interconnects. A die interconnect column cluster pitch is a distance between columns of adjacent die interconnect column clusters and this distance is greater than a die interconnect pitch between columns within the column clusters. Die interconnects may be disposed in the space between the multi-row column clusters and additional die interconnects can be disposed at the D2D interconnect pitch between the die interconnect column clusters. IC packages with ICs including the multi-row columnar die interconnects have a greater number of D2D interconnects for better IC integration.

23 Claims, 8 Drawing Sheets

(52) U.S. Cl.
CPC .............................. H01L 25/0655 (2013.01); *H01L 2224/16157* (2013.01); *H01L 2224/1712* (2013.01); *H01L 2924/37001* (2013.01)

(58) Field of Classification Search
CPC ... H01L 2224/0401; H01L 2224/06152; H01L 2224/06156; H01L 2224/14152; H01L 2224/14156; H01L 24/14; H01L 24/06; H10B 80/00
See application file for complete search history.

(56) References Cited

U.S. PATENT DOCUMENTS

| | | | |
|---|---|---|---|
| 2018/0157782 A1* | 6/2018 | Rossi | H01L 23/5386 |
| 2019/0198489 A1* | 6/2019 | Kim | H05K 1/181 |
| 2020/0111764 A1* | 4/2020 | Kim | G11C 5/025 |

* cited by examiner

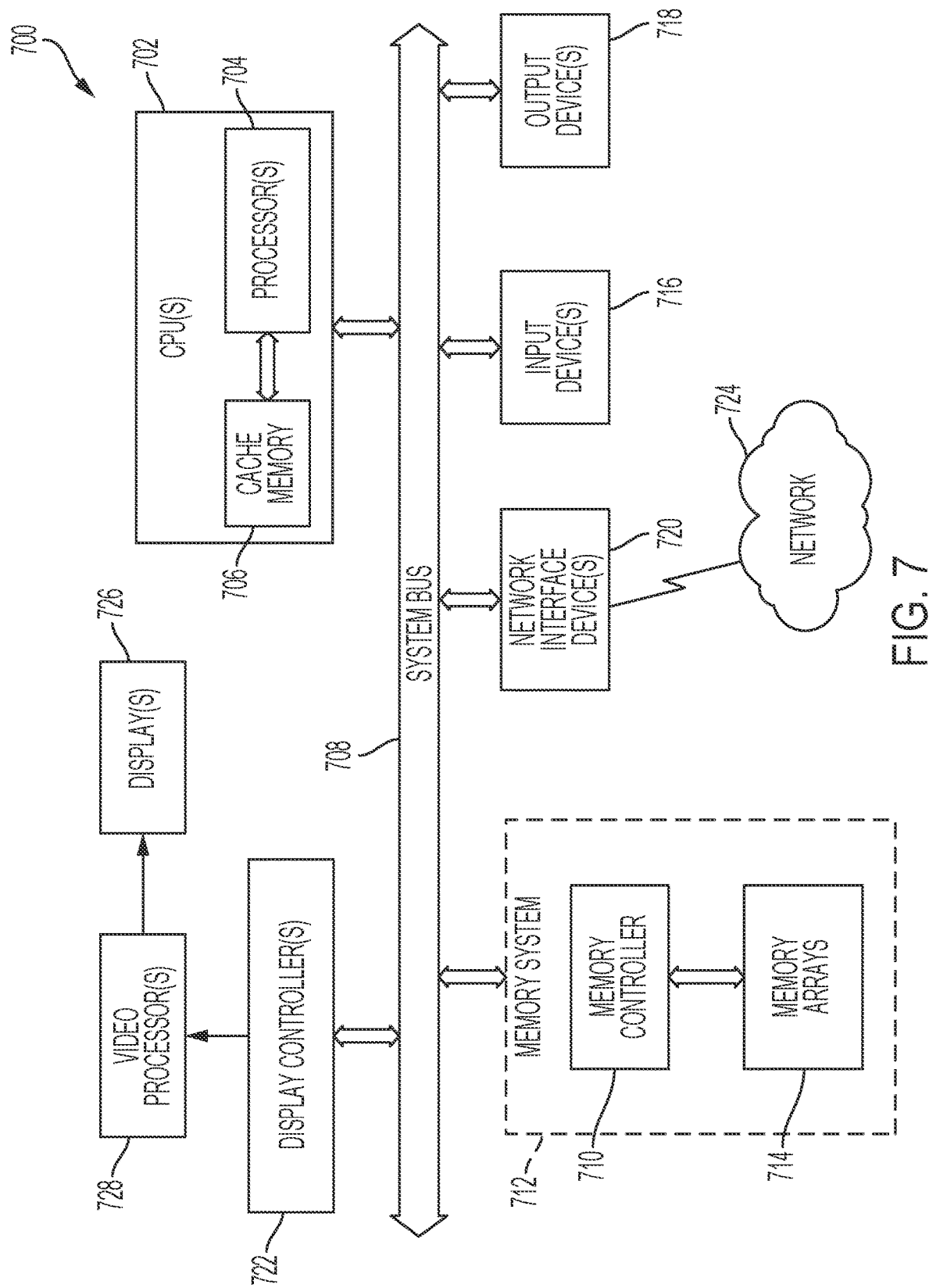

INTEGRATED CIRCUITS (ICS) WITH MULTI-ROW COLUMNAR DIE INTERCONNECTS AND IC PACKAGES INCLUDING HIGH DENSITY DIE-TO-DIE (D2D) INTERCONNECTS

BACKGROUND

I. Field of the Disclosure

The field of the disclosure relates generally to integrated circuits (ICs) and more specifically to interconnecting dies in IC packages.

II. Background

Manufacturers of consumer electronic devices seek to maximize device performance while minimizing device size because users prefer smaller devices and they are cheaper to manufacture. The functionality and performance of electronic devices is provided by integrated circuits (ICs). One way to increase the performance of an IC is to add circuitry which increases the size and complexity of the IC. As an IC increases in area and complexity, manufacturing yields are diminished, which increases product cost. An alternative approach to maximizing performance of an electronic device is to split the functionality among two or more IC dies in an IC package. Reducing the size and complexity of the IC dies improves yield. However, for two separate IC dies to approach the level of performance of a single IC requires a close level of integration, which may require high bandwidth interconnectivity between the IC dies. Such interconnectivity may require a large number of data signals and/or control signals to be transferred quickly between two IC dies in an IC package. Both the number of signals (i.e., wires) and the speed of signal transfer between devices depends on packaging considerations. The time for a signal to propagate between the IC dies depends, in part, on wire length. Thus, the signal propagation time can be minimized by positioning the first and second IC dies in close proximity to each other and by locating the signal connections for communication between a first IC die and a second IC die on the closest opposing edges of the respective IC dies. The number of die to die connections that can be placed at the opposing edges is limited by dimensions of the interconnect structures and technology requirements.

SUMMARY OF THE DISCLOSURE

Aspects disclosed herein include integrated circuits (ICs) with multi-row columnar die interconnects and IC packages including high density die-to-die (D2D) interconnects. Closely integrated ICs in an IC package are positioned edge to edge to minimize the length of D2D interconnects disposed along the IC edges. A maximum number of D2D interconnects in a conductive layer that fit along the length of the IC edge depends on the center-to-center distance or pitch of the D2D interconnects and also on the pitch of the die interconnects (e.g., bumps or studs) to which the D2D interconnects are coupled. The die interconnect pitch, which is significantly larger than the D2D interconnect pitch, can occupy much of the linear dimension of the IC edge, leaving less space for routing the D2D interconnects. In exemplary aspects, an IC package including ICs with multi-row columnar die interconnects for increased density of the D2D interconnects in a conductive layer is disclosed. Positioning the die interconnects in die interconnect column clusters, that each include a plurality of die interconnect rows and two columns, reduces the linear dimension occupied by the die interconnects and leaves room for more D2D interconnects. A die interconnect column cluster pitch is a distance between columns of adjacent die interconnect column clusters, and this distance is greater than a die interconnect pitch between columns within the column clusters. Die interconnects may be disposed in the space between the multi-row column clusters and additional die interconnects can be disposed at the D2D interconnect pitch between the die interconnect column clusters. IC packages with ICs including the multi-row columnar die interconnects have a greater number of D2D interconnects for better IC integration.

In an exemplary aspect, an integrated circuit (IC) comprising a substrate, a first die interconnect column cluster on the substrate, and a second die interconnect column cluster on the substrate is disclosed. The first die interconnect column cluster comprises a plurality of first die interconnect rows each comprising a first die interconnect spaced apart from a second die interconnect at a row die interconnect pitch. The second die interconnect column cluster comprises a plurality of second die interconnect rows each comprising a first die interconnect spaced apart from a second die interconnect at the row die interconnect pitch. The second die interconnect in each first die interconnect row of the plurality of first die interconnect rows is adjacent to the first die interconnect in a second die interconnect row of the plurality of second die interconnect rows and is spaced apart from the first die interconnect in the second die interconnect row of the plurality of second die interconnect rows at a column cluster pitch greater than the row die interconnect pitch.

In another exemplary aspect, an integrated circuit (IC) package comprising a first IC and a second IC are disclosed. Each of the first IC and the second IC further comprises a first die interconnect column cluster and a second die interconnect column cluster. The first die interconnect column cluster comprises a plurality of first die interconnect rows each comprising a first die interconnect spaced apart from a second die interconnect at a row die interconnect pitch. The second die interconnect column cluster comprises a plurality of second die interconnect rows each comprising a first die interconnect spaced apart from a second die interconnect at the row die interconnect pitch. The second die interconnect in each first die interconnect row of the plurality of first die interconnect rows is adjacent to the first die interconnect in a second die interconnect row of the plurality of second die interconnect rows and is spaced apart from the first die interconnect in the second die interconnect row of the plurality of second die interconnect rows by a column cluster pitch greater than the row die interconnect pitch.

BRIEF DESCRIPTION OF THE FIGURES

FIG. 7 is a block diagram of an exemplary IC package including ICs that have multi-row columnar die interconnects for higher density D2D interconnects as shown in FIG. 4 or FIG. 5, and according to any of the aspects disclosed herein.

DETAILED DESCRIPTION

Figure 1:
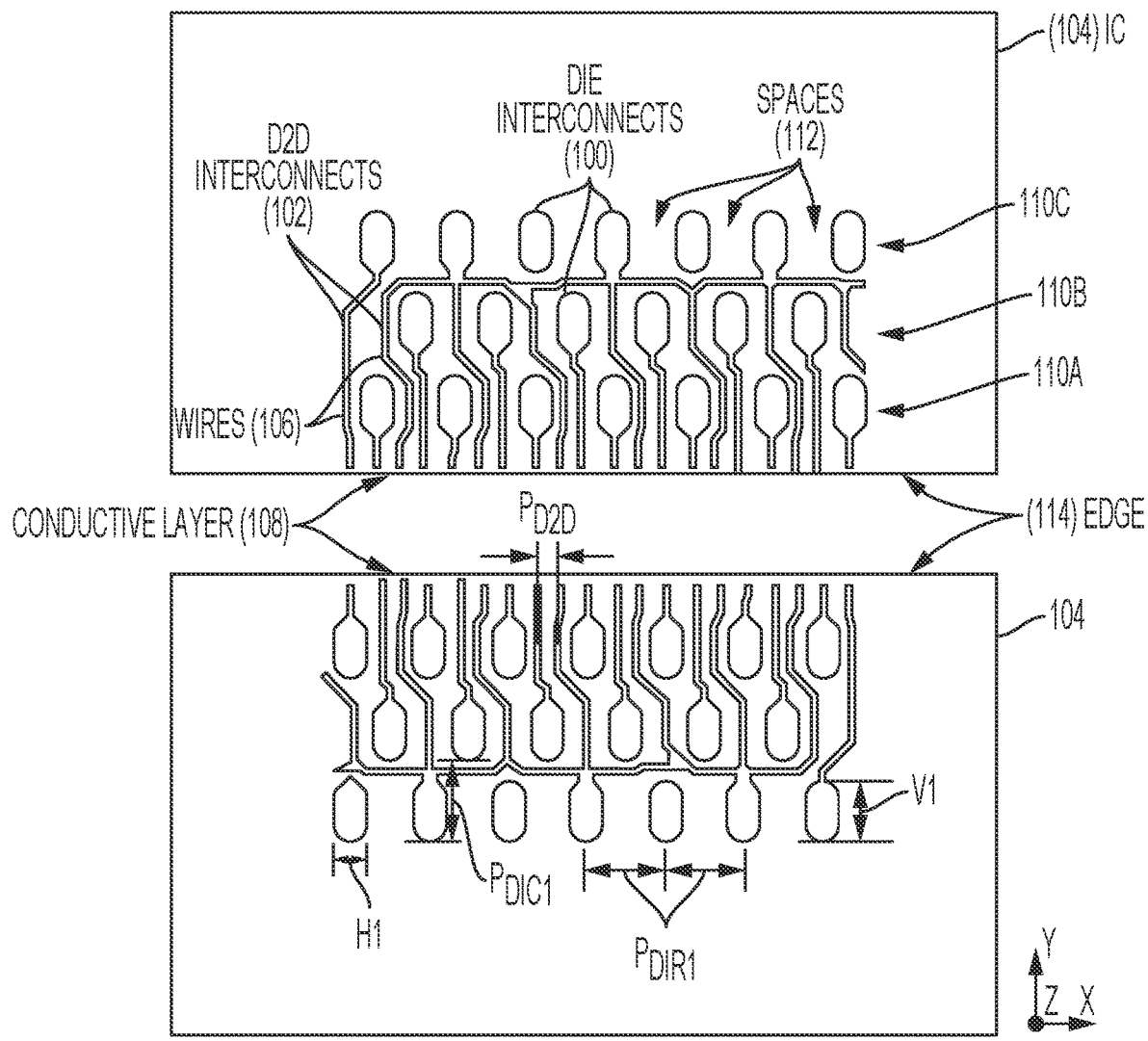
FIG. 1 is an illustration of a top view of die-to-die (D2D) interconnects coupled to die interconnects in a conductive layer on edges of two integrated circuit (ICs) coupled to each other.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuits (ICs) with multi-row columnar die interconnects and IC packages including high density die-to-die (D2D) interconnects. Closely integrated ICs in an IC package are positioned edge to edge to minimize the length of D2D interconnects disposed along the IC edges. A maximum number of D2D interconnects in a conductive layer that fit along the length of the IC edge depends on the center-to-center distance or pitch of the D2D interconnects and also on the pitch of the die interconnects (e.g., bumps or studs) to which the D2D interconnects are coupled. The die interconnect pitch, which is significantly larger than the D2D interconnect pitch, can occupy much of the linear dimension of the IC edge, leaving less space for routing the D2D interconnects. In exemplary aspects, an IC package including ICs with multi-row columnar die interconnects for increased density of the D2D interconnects in a conductive layer is disclosed. Positioning the die interconnects in die interconnect column clusters, that each include a plurality of die interconnect rows and two columns, reduces the linear dimension occupied by the die interconnects and leaves room for more D2D interconnects. A die interconnect column cluster pitch is a distance between columns of adjacent die interconnect column clusters, and this distance is greater than a die interconnect pitch between columns within the column clusters. Die interconnects may be disposed in the space between the multi-row column clusters and additional die interconnects can be disposed at the D2D interconnect pitch between the die interconnect column clusters. IC packages with ICs including the multi-row columnar die interconnects have a greater number of D2D interconnects for better IC integration.

FIG. 1 is an illustration of a top view of die interconnects 100 coupled to D2D interconnects 102 used to interconnect the ICs 104 edge to edge. The D2D interconnects 102 in FIG. 1 are wires 106 disposed in a conductive layer 108 coupling one of the die interconnects 100 on a first one of the ICs 104 to one or more of the die interconnects 100 on the other one of the ICs 104. The die interconnects 100 in FIG. 1 are bumps or studs of a conductive metal or metal alloy disposed on the ICs 104 to couple a circuit layer (not shown) of the ICs 104 to an external circuit. The conductive layer 108 may be, for example, metal or a metal alloy. The die interconnects 100 have a horizontal dimension HI and a vertical dimension V1 and are separated from each other according to technology and/or fabrication limitations. The die interconnects 100 are spaced horizontally at a row die interconnect pitch $P_{DIR1}$ and spaced vertically at a column die interconnect pitch $P_{DIC1}$.

To maximize a number of the die interconnects 100 on an IC 104, the die interconnects are arranged in a first row 110A, a middle row 110B, and a last row 110C extending horizontally (i.e., X-axis direction), where the die interconnects 100 in the middle row 110B are centered on spaces 112 between the die interconnects 100 in the first row 110A and the last row 110C. The die interconnects 100 in the middle row 1101B are not aligned in a vertical direction (i.e., Y-axis direction) with the die interconnects 100 of the first row 110A and the last row 110C.

In contrast, the D2D interconnects 102 can be disposed at a pitch $P_{D2D}$, which is smaller than the row die interconnect pitch $P_{DIR1}$. Thus, the D2D interconnects 102 can be closer to the die interconnects 100 than the die interconnects 100 can be to each other. This allows two (2) D2D interconnects 102 to be routed between the die interconnects 100 that are separated at the row die interconnect pitch $P_{DIR1}$ in the first row 110A.

However, the arrangement in FIG. 1 for optimizing density of the die interconnects 100 includes only three (3) D2D interconnects 102 within the row die interconnect pitch $P_{DIR1}$ (i.e., for each die interconnect 100) along an edge 114 of the IC 104. Thus, maximizing density of the die interconnects 100 does not maximize a number of the D2D interconnects 102 that will fit in the conductive layer 108 along the edge 114. Since integration of the ICs 104 can be limited by a number of the D2D interconnects 102, integration of the ICs 104 is limited by the arrangement of the die interconnects 100 in FIG. 1. To increase a level of integration of the ICs 104, density of the D2D interconnects 102 along the edge 114 needs to be increased. Such increase in density could be achieved by locating fewer of the die interconnects 100 in the first row 110A along the edge 114, which would make room for more of the D2D interconnects 102.

Figure 2:
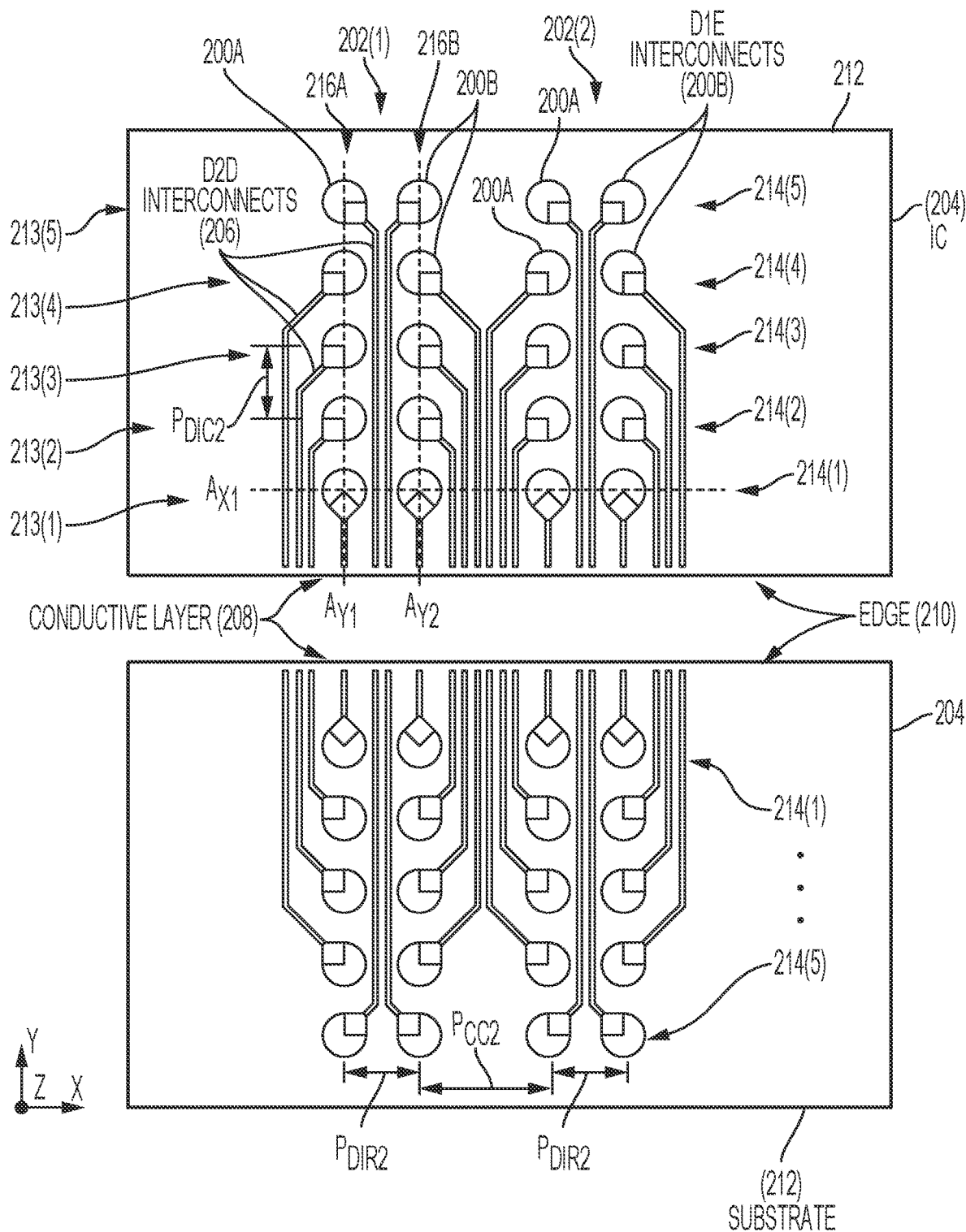
FIG. 2 is an illustration of a top view of exemplary multi-row columnar die interconnects in die interconnect column clusters in a conductive layer with increased D2D interconnect density in an IC package.

In this regard, FIG. 2 is an illustration of a top view of exemplary multi-row columnar die interconnects 200A and 200B ("first die interconnect 200A" and "second die interconnect 200B") disposed in die interconnect column clusters 202 on ICs 204. The die interconnect column clusters 202 include a first die interconnect column cluster 202(1) and a second die interconnect column cluster 202(2). The die interconnects 200A and 200B disposed in the die interconnect column clusters 202(1) and 202(2) allow a higher density of D2D interconnects 206 to be routed in a conductive layer 208 along an edge 210 from one IC 204 to the other IC 204. The conductive layer 208 may be, for example, a metal layer or layer of metal alloy. Since each of the first and second die interconnects 200A and 200B is configured to couple a circuit layer (not shown) of a substrate 212 of an IC 204 to an external circuit (e.g., another IC 204), the higher density of D2D interconnects 206 in FIG. 2 provides a higher level of integration between the circuit layers of the ICs 204 than in FIG. 1.

The die interconnect column cluster 202(1) includes a plurality of first die interconnect rows 213(1)-213(5) that each include a first die interconnect 200A and a second die interconnect 200B and the die interconnect column cluster 202(2) includes a plurality of second die interconnect rows 214(1)-214(5) that each include a first die interconnect 200A and a second die interconnect 200B. Within each of the first die interconnect rows 213(1)-213(5) in the first die interconnect column cluster 202(1), the first die interconnect 200A is separated from the second die interconnect 200B at a row die interconnect pitch $P_{DIR2}$.

In addition, a second die interconnect column cluster 202(2) includes a plurality of second die interconnect rows 214(1)-214(5). The first and second die interconnects 200A and 200B in the first die interconnect row 213(1) are spaced apart along an axis $A_{X1}$ extending in the X-axis direction (e.g., horizontally in FIG. 2) at the row die interconnect pitch $P_{DIR2}$. The first and second die interconnects 200A and 200B of a corresponding second die interconnect row 214(1) of the second die interconnect column cluster 202(2) are also spaced apart along the axis $A_{X1}$ at the row die interconnect pitch $P_{DIR2}$. In an example, the axis $A_{X1}$ may be parallel to the edge 210 of the substrate 212.

Two D2D interconnects 206 can be routed between the first and second die interconnects 200A and 200B that are spaced apart at the row die interconnect pitch $P_{DIR2}$ in each of the first die interconnect rows 213(1)-213(5). The first die interconnect column cluster 202(1) and the second die interconnect column cluster 202(2) are spaced apart at a column cluster pitch $P_{CC2}$ that is greater than the row die interconnect pitch $P_{DIR2}$. For example, the second die interconnect 200B in the first die interconnect row 213(1) in the first die interconnect column cluster 202(1) is adjacent to (e.g., next closest to) a first die interconnect 200A in the corresponding second die interconnect row 214(1) in the second die interconnect column cluster 202(2) (e.g., along the axis $A_{X1}$). The second die interconnect 200B in the first die interconnect row 213(1) is spaced apart from the first die interconnect 200A in the second die interconnect row 214(1) at the column cluster pitch $P_{CC2}$. The second die interconnect 200B in the first die interconnect column cluster 202(1) is considered to be adjacent to the first die interconnect 200A of the second die interconnect column cluster 202(2) because the second die interconnect 200B is the next closest one of the die interconnects to the first die interconnect 200A of the second die interconnect column cluster 202(2) (e.g., along the axis $A_{X1}$).

The column cluster pitch $P_{CC2}$ is greater than the row die interconnect pitch $P_{DIR2}$. Thus, compared to FIG. 1, the first and second die interconnects 200A and 200B occupy less of the linear range along the edge 210, leaving room for more of the D2D interconnects 206 to fit along the edge 210 between the die interconnect column clusters 202. In this regard, a density of the D2D interconnects 206 on the edge 210 in FIG. 2 is higher than a density of the D2D interconnects 102 along the edge 114 in FIG. 1. This higher density of the D2D interconnects 206 increases a total number of the D2D interconnects 206, making it possible to achieve a higher level of integration using multi-row columnar first and second die interconnects 200A and 200B in FIG. 2 than with the die interconnects 100 in FIG. 1.

With continued reference to FIG. 2, a number of the plurality of first die interconnect rows 213(1)-213(5) and second die interconnect rows 214(1)-214(5) in the first and second die interconnect column clusters 202(1) and 202(2) may be at least three (3) and up to six (6) or more. The plurality of first die interconnect rows 213(1)-213(5) within the first die interconnect column cluster 202(1) are aligned such that the first die interconnects 200A are arranged in a first column 216A along an axis $A_{Y1}$ (e.g., extending in the Y-axis direction (vertically) in FIG. 2) and are spaced apart at a column die interconnect pitch $P_{DIC2}$. The second die interconnects 200B in the first die interconnect column cluster 202(1) are arranged in a second column 216B along an axis $A_{Y2}$ and are also spaced apart at the column die interconnect pitch $P_{DIC2}$. In some examples, the column die interconnect pitch $P_{DIC2}$ is the same as the row die interconnect pitch $P_{DIR2}$.

In an example not shown in FIG. 2, each of the ICs 204 could include a third die interconnect column cluster (not shown) including the first die interconnects 200A spaced apart from the second die interconnects 200B at the row die interconnect pitch $P_{DIR2}$ along the axis $A_{X1}$, as in the first and second die interconnect column clusters 202(1) and 202(2). Additional die interconnect column clusters may be included depending on dimensions of the edge 210 of the ICs 204.

The die interconnects 200A and 200B in FIG. 2 may be, for example, bumps or studs formed of solder, copper, aluminum or a metal alloy on the ICs 204. The D2D interconnects 206 are, for example, wires, traces, or lines of a metal or conductive material.

Figure 3A:
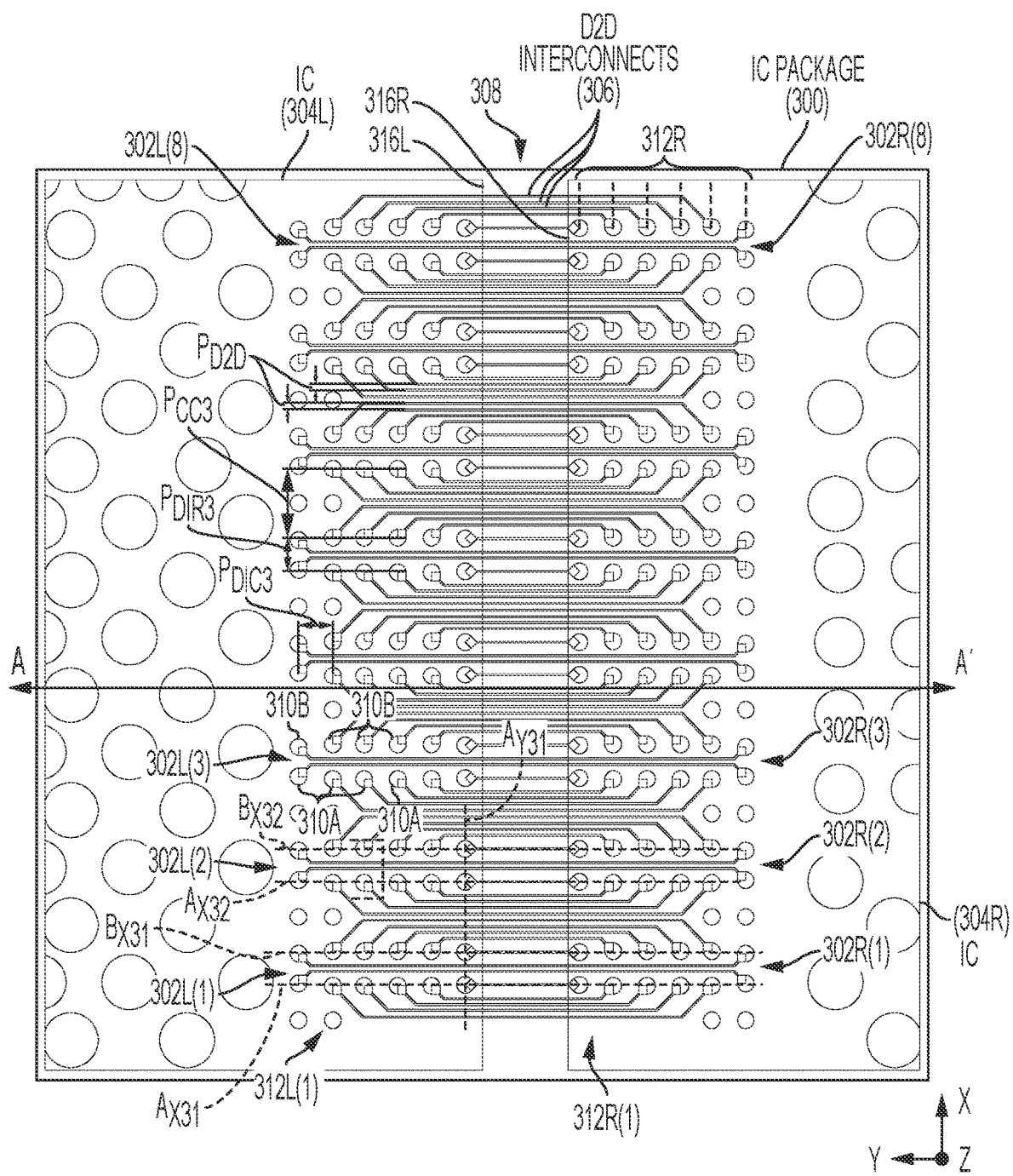
FIGS. 3A and 3B are illustrations of a top view of a die interconnect column clusters in the ICs of FIG. 2 coupled to each other by high density D2D interconnects in a conductive layer in an exemplary IC package.
Figure 3B:
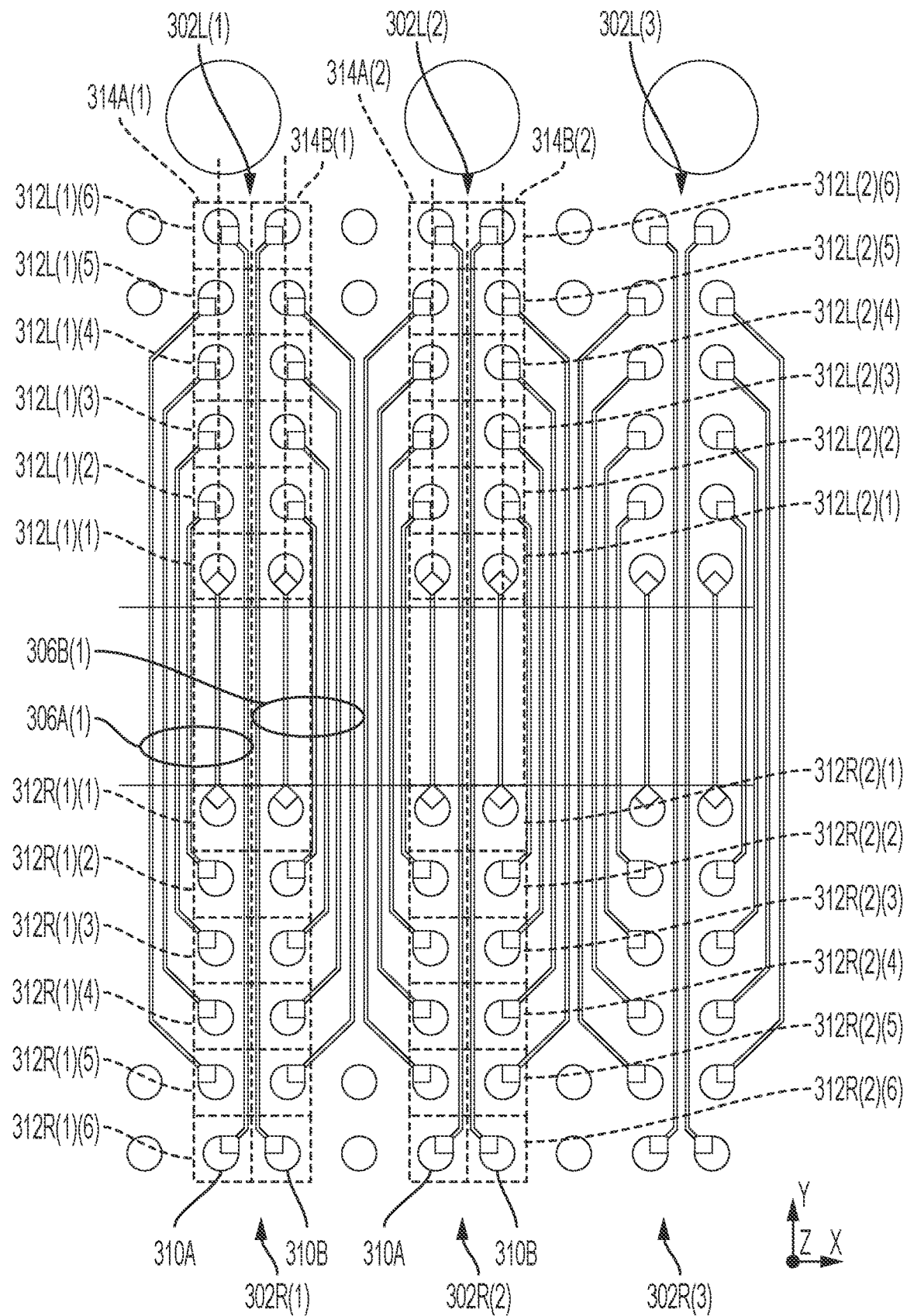

FIGS. 3A and 3B are illustrations of a top view of an IC package 300 including die interconnect column clusters 302L(1)-302L(8) in IC 304L coupled to die interconnect column clusters 302R(1)-302R(8) in IC 304R by D2D interconnects 306 in a conductive layer 308, which may be metal or a metal alloy or other conductive material. Die interconnects 310A and 310B in each of the die interconnect column clusters 302L(1)-302L(8) and 302R(1)-302R(8) are configured to couple the circuit layers (not shown) of the ICs 304L and 304R externally (e.g., to each other).

Arranging the die interconnects 310A and 310B in the die interconnect column clusters 302L(1)-302L(8) and 302R(1)-302R(8) (collectively die interconnect column clusters 302) makes possible a more dense routing of the D2D interconnects 306 in the conductive layer 308 than in the ICs in FIG. 1. Thus, a detailed description of the arrangement of the die interconnects 310A and 310B is provided. A description is provided with particular reference to the first die interconnect column cluster 302L(1) and the second die interconnect column cluster 302L(2).

The first die interconnect column cluster 302L(1) includes a plurality of first die interconnect rows 312L(1)(1)-312L(1)(6)(collectively "312L(1)"), and the second die interconnect column cluster 302L(2) includes a plurality of second die interconnect rows 312L(2)(1)-312L(2)(6) (collectively "312L(2)"). The die interconnects 310A and 310B in each of the first die interconnect rows 312L(1) include a first die interconnect 310A spaced apart in the X-axis direction from a second die interconnect 310B at a row die interconnect pitch $P_{DIR3}$. However, spacing in the X-axis direction between the second die interconnects 310B in the first die interconnect column cluster 302L(1) and an adjacent first die interconnect 310A in the second die interconnect column cluster 302L(2) is at a column cluster pitch $P_{CC3}$ that is greater than the row die interconnect pitch $P_{DIR3}$. The second die interconnects 310B in the second die interconnect column cluster 302L(2) are adjacent to the first die interconnects 310A in the second die interconnect column cluster 302L(2) because the second die interconnects 310B in the plurality of first die interconnect rows 312L(1) of the first die interconnect column cluster 302L(1) are next to the first die interconnects 310A in the plurality of second die interconnect rows 312L(2) along an axis $A_{Y31}$ extending horizontally (i.e., in the Y-axis direction in FIG. 3A). The column cluster pitch $P_{CC3}$ being greater than the row die interconnect pitch $P_{DIR3}$ allows more of the D2D interconnects 306 to be routed in the conductive layer 308 between the first die interconnect column cluster 302L(1) and the second die interconnect column cluster 302L(2) than between the first and second die interconnects 310A and 310B in, for example, the plurality of first die interconnect rows 312L(1).

The plurality of first die interconnect rows 312L(1) includes first die interconnect rows 312L(1)(1)-312L(1)(6) and the plurality of second die interconnect rows 312L(2) includes second die interconnect rows 312L(2)(1)-312L(2)(6). The first die interconnect rows 312L(1))(1)-312L(1)(6) are spaced apart from each other at a column die interconnect pitch $P_{DIC3}$ in the Y-axis direction and the second die interconnect rows 312L(2)(1)-312L(2)(6) are also spaced apart from each other at the column die interconnect pitch $P_{DIC3}$ in the Y-axis direction. Thus, the first die interconnects 310A of the first die interconnect rows 312L(1))(1)-312L(1)(6) are spaced apart from each other at the column die interconnect pitch $P_{DIC3}$ in a column 314A(1) along an axis $A_{X31}$ in the X-axis direction. The second die interconnects 310B of the first die interconnect rows 312L(1)(1)-312L(1)(6) are spaced apart from each other at the column die interconnect pitch $P_{DIC3}$ in a column 314B(1) along an axis $B_{X31}$. The first die interconnects 310A of the second die interconnect rows 312L(2)(1)-312L(2)(6) are spaced apart from each other at the column die interconnect pitch $P_{DIC3}$ in a column 314A(2) along an axis $A_{X32}$. In some examples, the column die interconnect pitch $P_{DIC3}$ is the same as the row die interconnect pitch $P_{DIR3}$.

The first die interconnect column cluster 302L(1) and the second die interconnect column cluster 302L(2) in the IC 304L are coupled to through the D2D interconnects 306 in the conductive layer 308 to the first die interconnect column cluster 302R(1) and the second die interconnect column cluster 302R(2) in the IC 304R, respectively.

The D2D interconnects 306 include a first plurality of the D2D interconnects 306A(1) to couple the first die interconnects 310A of the first die interconnect column cluster 302L(1) to the first die interconnects 310A of the first die interconnect column cluster 302R(1). The D2D interconnects 306 also include a second plurality of the D2D interconnects 306B(1) to couple the second die interconnects 310B of the first die interconnect column cluster 302L(1) to the second die interconnects 310B of the first die interconnect column cluster 302R(1). A third plurality of the D2D interconnects 306A(2) couple the first die interconnects 310A of the second die interconnect column cluster 302L(2) to the first die interconnects 310A of the second die interconnect column cluster 302R(2).

One of the first plurality of D2D interconnects 306A(1) extends along the axis $A_{X31}$ and couples the first die interconnect 310A in the first die interconnect row 312L(1)(1) (i.e., closest to an edge 316L of the IC 304L) to the first die interconnect 310A in the first die interconnect row 312R(1)(1) that is closest to the edge 316R in the IC 304R. Another one of the first plurality of D2D interconnects 306A(1) is disposed between the axis $A_{X31}$ and the axis $B_{X31}$ to couple one of the first die interconnects 310A in another one of the plurality of first die interconnect rows 312L(1) to one of the first die interconnects 310A in another one of the plurality of first die interconnect rows 312R(1).

One of the second plurality of D2D interconnects 306B(1) extends along the axis $B_{X31}$ and couples the second die interconnect 310B in the first die interconnect row 312L(1) (1) to the second die interconnect 310B in the first die interconnect row 312R(1)(1) in the IC 304R. Another one of the second plurality of D2D interconnects 306B(1) is disposed between the axis $A_{X32}$ and the axis $B_{X31}$ to couple one of the second die interconnects 310B in another one of the plurality of first die interconnect rows 312L(1) to one of the second die interconnects 310B in another one of the plurality of first die interconnect rows 312R(1).

One of the third plurality of D2D interconnects 306A(2) extends along the axis $A_{Y2}$ and couples the first die interconnect 310A in the second die interconnect row 312L(2) (1)(i.e., closest to an edge 316L of the IC 304L) to the first die interconnect 310A in the second die interconnect row 312R(2)(1) that is closest to the edge 316R in the IC 304R. Another one of the third plurality of D2D interconnects 306A(2) is disposed between the axis $A_{X32}$ and an axis $B_{X32}$ to couple one of the first die interconnects 310A in another one of the plurality of second die interconnect rows 312L(2) to one of the first die interconnects 310A in another one of the plurality of second die interconnect rows 312R(2).

A number $N_{B1}$ is the number of the second plurality of D2D interconnects 306B(1), which depends on a number of the plurality of first die interconnect rows 312L(1) and a number $N_{A2}$ is the number of the third plurality of D2D interconnects 306A(2), which depends on a number of the plurality of second die interconnect rows 312L(2). Since one of the second plurality of D2D interconnects 306B(1) extends along the axis $B_{X31}$ and another one of the second plurality of D2D interconnects 306B(1) is disposed between the axis $A_{X31}$ and the axis $B_{X31}$, a number $M_{B1}$ (where $M_{B1}=N_{B1}-2$) is the number of the second plurality of D2D interconnects 306B(1) routed between the first die interconnect column cluster 302L(1) and the second die interconnect column cluster 302L(2). That is, the number $M_{B1}$ of the second plurality of D2D interconnects 306B(1) is equal to all but two of the second plurality of D2D interconnects 306B(1). Similarly, a number $M_{A2}$ (where $M_{A2}=N_{A2}-2$) is the number of the third plurality of D2D interconnects 306A(2) including all but two of the third plurality of D2D interconnects 306A(2). The number $M_A$ of the third plurality of D2D interconnects 306A(2) are also disposed between the axis $B_{X31}$ and the axis $A_{X32}$.

A total $T_{B1A2}$ (where $T_{B1A2}=M_{B1}+M_{A2}$) of the second plurality of D2D interconnects 306B(1) and the third plurality of D2D interconnects 306A(2) that are disposed in the conductive layer 308 between the first die interconnect column cluster 302L(1) and the second die interconnect column cluster 302L(2) depends on a number of the plurality of first die interconnect rows 312L(1) and a number of the plurality of second die interconnect rows 312L(2). Therefore, the column cluster pitch $P_{CC3}$, which must be at least wide enough to include the total $T_{B1A2}$ of the second plurality of D2D interconnects 306B(1) and the third plurality of D2D interconnects 306A(2), depends on the number of the plurality of first die interconnect rows 312L(1) and the number of the plurality of second die interconnect rows 312L(2). The column cluster pitch $P_{CC3}$ also depends on a D2D interconnect pitch $P_{D2D}$ of the D2D interconnects 306. In this regard, the column cluster pitch $P_{CC3}$ is at least total $T_{B1A2}$ (where $T_{B1A2}=M_{B1}+M_{A2}$) times the D2D interconnect pitch $P_{D2D}$.

Figure 4:
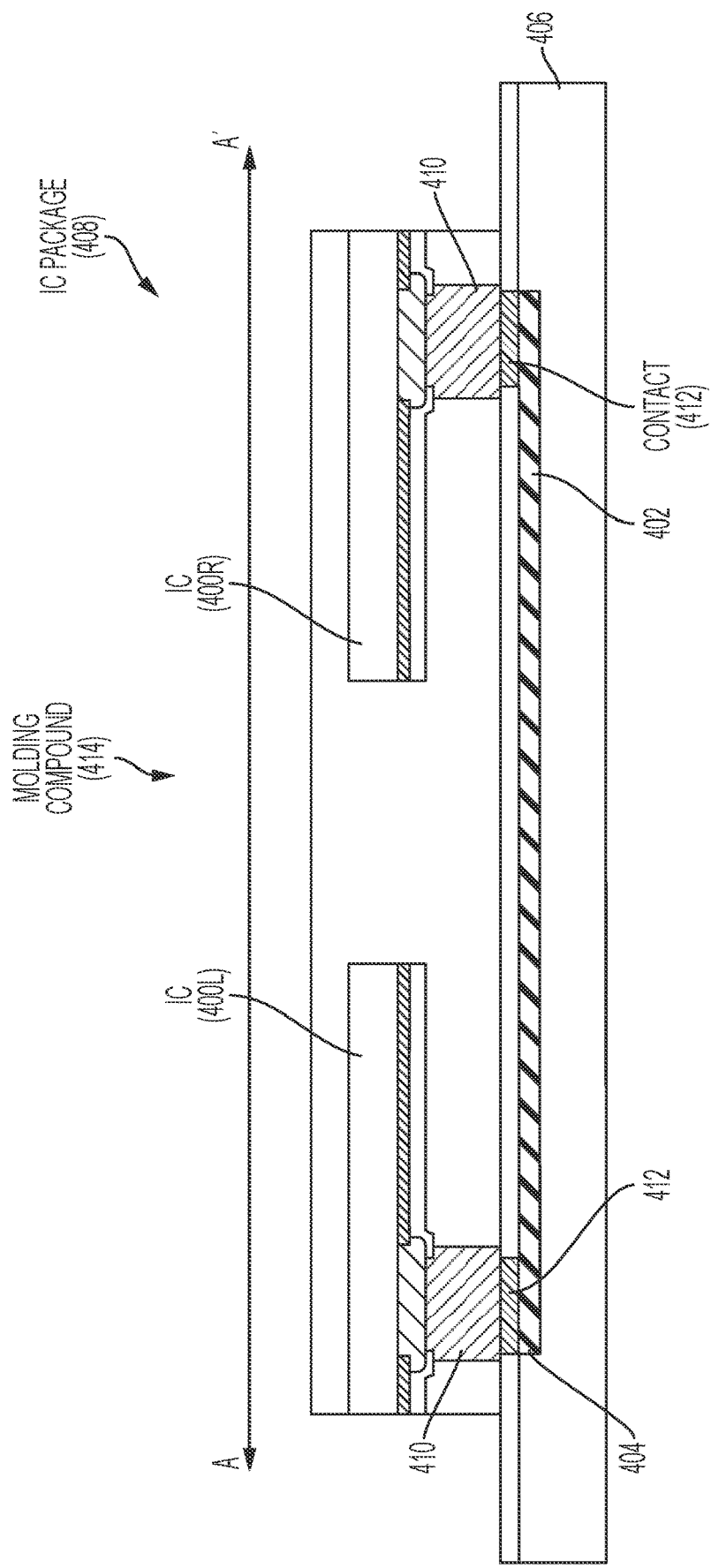
FIG. 4 is an illustration of a cross-sectional side view of ICs interconnected by a conductive layer in a substrate in a first IC package including the two ICs of FIGS. 2, 3A, and 3B.

FIG. 4 is an illustration of a cross-sectional side view of ICs 400L and 400R, which correspond to the ICs 304L and 304R in FIGS. 3A and 3B. The ICs 400L and 400R are interconnected by a D2D interconnect 402 in a conductive layer 404 disposed in a substrate 406 of an IC package 408. The D2D interconnects 402 are formed in the conductive layer 404 during formation of the substrate 406. The IC package 408 is one example employing the exemplary aspects disclosed above. The ICs 400L and 400R are disposed on and coupled to the substrate 406 by die interconnects 410. Although only one of the die interconnects 410 is shown for each of the ICs 400L and 400R, it should be understood that the ICs 400L and 400R include a plurality of die interconnects 410 corresponding to the first and second die interconnects 310A and 310B in FIGS. 3A and 3B. The ICs 400L and 400R are coupled to the substrate 406 in a flip-chip configuration in which the die interconnects 410 are between the ICs 400L and 400R and the substrate 406 and are coupled to the conductive layer 404 by contacts 412. The contacts 412 may be disposed over all or a portion of a surface of the die interconnects 410. Thus, the conductive layer 404 may include an area of the die interconnects 410. The ICs 400L and 400R are encompassed by a molding compound 414 providing structural integrity to the IC package 408.

Figure 5:
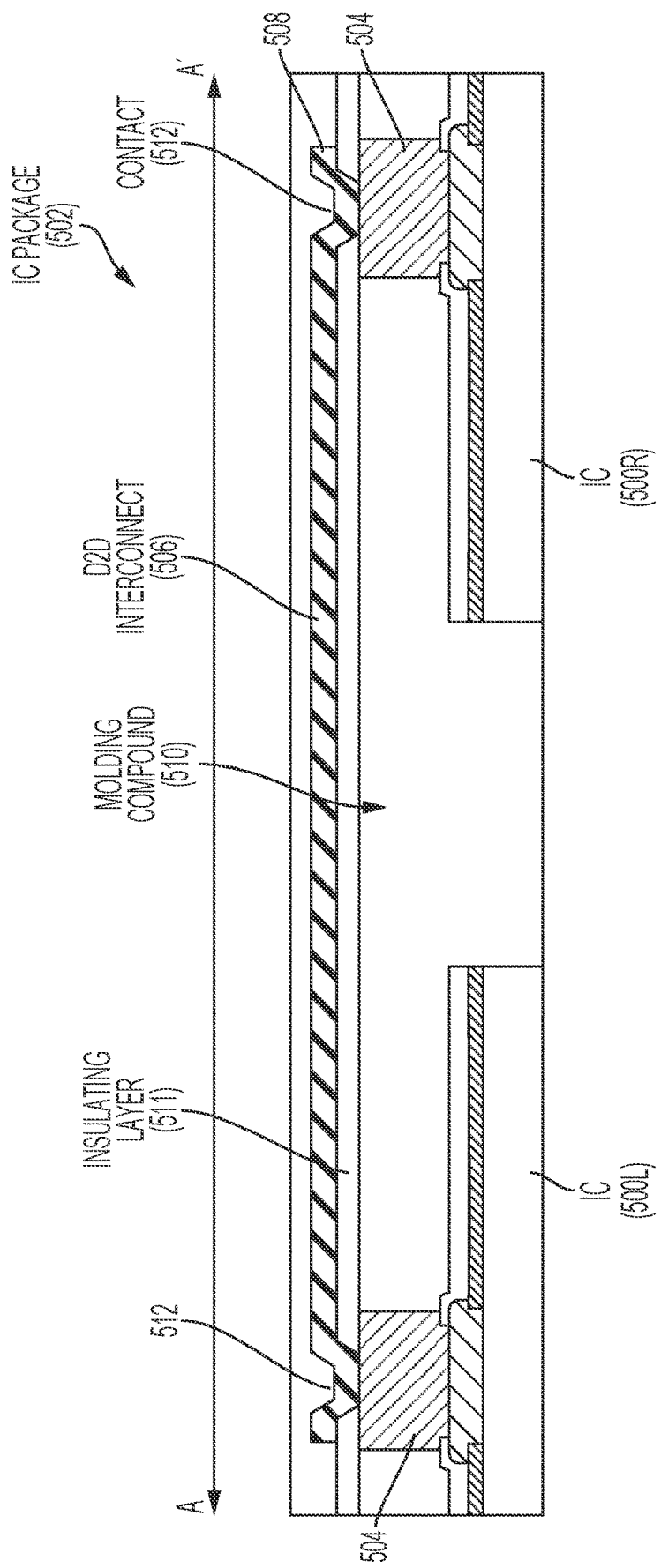
FIG. 5 is an illustration of a cross-sectional side view of ICs interconnected by a conductive layer disposed on the two ICs of FIGS. 2, 3A, and 3B in a second IC package.

FIG. 5 is an illustration of a cross-sectional view of ICs 500L and 500R in an IC package 502 that includes the exemplary aspects discussed above. The ICs 500L and 500R correspond to the ICs 304L and 304R in FIGS. 3A and 3B. In the configuration in FIG. 5, die interconnects 504 are coupled to each other by a D2D interconnect 506 formed in a conductive layer 508. A molding compound 510 surrounds the ICs 500L and 500R and the die interconnects 504. An insulating layer 511 formed over the molding compound 510 is removed from above the die interconnects 504. Thus, the conductive layer 508 forms contacts 512 on the die interconnects 504 during formation of the conductive layer 508 on the insulating layer 511. The conductive layer 508 is patterned to form the D2D interconnects 506.

Figure 6:
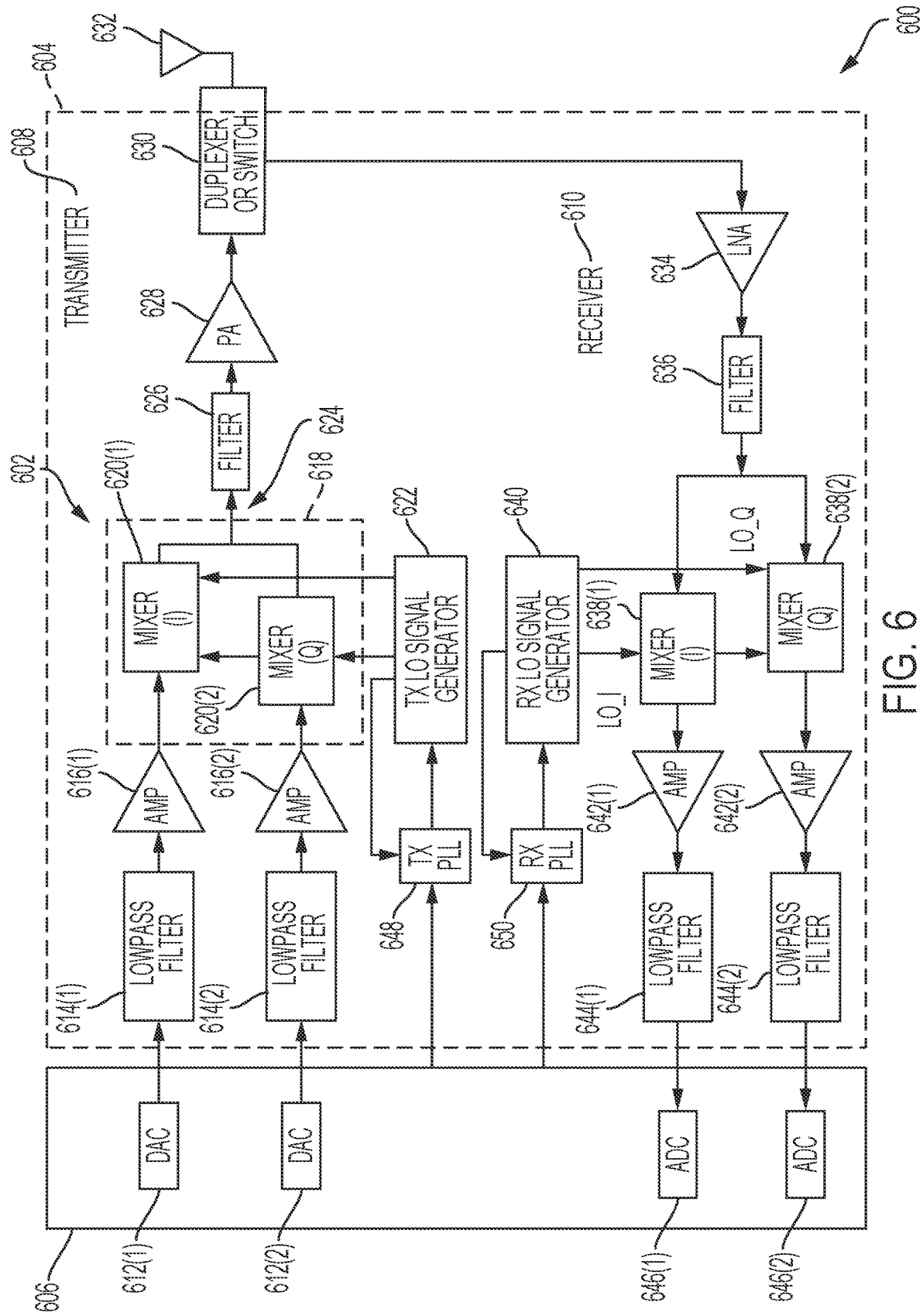
FIG. 6 is a block diagram of an exemplary wireless communications device that includes a radio-frequency (RF) module including an IC package with edge to edge ICs that have multi-row columnar die interconnects for higher density D2D interconnects as shown in FIG. 4 or FIG. 5.

FIG. 6 illustrates an exemplary wireless communications device 600 that includes radio-frequency (RF) components formed from one or more integrated circuits (ICs) 602, wherein any of the ICs 602 can include exemplary multi-row columnar die interconnects disposed at IC edges in die interconnect column clusters for increased D2D interconnect density as illustrated in FIGS. 2, 3A, and 3B, and according to any of the aspects disclosed herein. The wireless communications device 600 may include or be provided in any of the above-referenced devices, as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communications. In general, the wireless communications device 600 may include any number of transmitters 608 and/or receivers 610 for any number of communication systems and frequency bands. All or a portion of the transceiver 604 may be implemented on one or more analog ICs, RFICs, mixed-signal ICs, etc.

The transmitter 608 or the receiver 610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into the I and Q analog output signals, e.g., I and Q output currents, for further processing.

Within the transmitter 608, lowpass filters 614(1), 614(2) filter the I and Q analog output signals, respectively, to remove undesired signals caused by the prior digital-to-analog conversion. Amplifiers (AMPs) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals from a TX LO signal generator 622 through mixers 620(1), 620(2) to provide an upconverted signal 624. A filter 626 filters the upconverted signal 624 to remove undesired signals caused by the frequency upconversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Downconversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by AMPs 642(1), 642(2) and further filtered by lowpass filters 644(1), 644(2) to obtain I and Q analog input signals, which are provided to the data processor 606. In this example, the data processor 606 includes analog-to-digital converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency upconversion, while the RX LO signal generator 640 generates the I and Q RX LO signals used for frequency downconversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Wireless communications devices 600 that each include exemplary multi-row columnar die interconnects disposed at IC edges in die interconnect column clusters for increased D2D interconnect density as illustrated in FIGS. 2, 3A, and 3B, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 7 illustrates an example of a processor-based system 700 including multi-row columnar die interconnects disposed at IC edges in die interconnect column clusters for increased D2D interconnect density as illustrated in FIGS. 2, 3A, and 3B, and according to any aspects disclosed herein. In this example, the processor-based system 700 includes one or more central processor units (CPUs) 702, which may also be referred to as CPU or processor cores, each including one or more processors 704. The CPU(s) 702 may have cache memory 706 coupled to the processor(s) 704 for rapid access to temporarily stored data. As an example, the processor(s) 704 could include exemplary multi-row columnar die interconnects disposed at IC edges in die interconnect column clusters for increased D2D interconnect density as illustrated in FIGS. 2, 3A, and 3B, and according to any aspects disclosed herein. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712 that includes the memory controller 710 and one or more memory arrays 714, one or more input devices 716, one or more output devices 718, one or more network interface devices 720, and one or more display controllers 722, as examples. Each of the memory system 712, the one or more input devices 716, the one or more output devices 718, the one or more network interface devices 720, and the one or more display controllers 722 can include exemplary multi-row columnar die interconnects disposed at IC edges in die interconnect column clusters for increased D2D interconnect density as illustrated in FIGS. 2, 3A, and 3B, and according to any of the aspects disclosed herein. The input device(s) 716 can include any type of input device, including, but not limited to, input keys, switches, voice processors, etc. The output device(s) 718 can include any type of output device, including, but not limited to, audio, video, other visual indicators, etc. The network interface device(s) 720 can be any device configured to allow exchange of data to and from a network 724. The network 724 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 720 can be configured to support any type of communications protocol desired.

The CPU(s) 702 may also be configured to access the display controller(s) 722 over the system bus 708 to control display information sent to one or more displays 726. The display controller(s) 722 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc. The display controller(s) 722, display(s) 726, and/or the video processor(s) 728 can include exemplary multi-row columnar die interconnects disposed at IC edges in die interconnect column clusters for increased D2D interconnect density as illustrated in FIGS. 2, 3A, and 3B, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. An integrated circuit (IC) die comprising:
   a substrate;
   a first die interconnect column cluster on the substrate, comprising:
      a plurality of first die interconnect rows each comprising a first die interconnect spaced apart from a second die interconnect at a row die interconnect pitch; and
   a second die interconnect column cluster on the substrate, comprising:
      a plurality of second die interconnect rows each comprising a first die interconnect spaced apart from a second die interconnect at the row die interconnect pitch;
   wherein:
      the second die interconnect in each first die interconnect row of the plurality of first die interconnect rows is adjacent to the first die interconnect in a second die interconnect row of the plurality of second die interconnect rows and is spaced apart from the first die interconnect in the second die interconnect row of the plurality of second die interconnect rows at a column cluster pitch greater than the row die interconnect pitch.

2. The IC die of clause 1, wherein:
   the plurality of first die interconnect rows in the first die interconnect column cluster comprises at least three (3) first die interconnect rows; and
   the plurality of second die interconnect rows in the second die interconnect column cluster comprises at least three (3) second die interconnect rows.

3. The IC die of clause 1 or clause 2, wherein a first die interconnect row of the plurality of first die interconnect rows in the first die interconnect column cluster and a second die interconnect row of the plurality of second die interconnect rows in the second die interconnect column cluster are spaced apart along a first axis in a first axis direction.

4. The IC die of clause 3, wherein the first die interconnects in the plurality of first die interconnect rows in the first die interconnect column cluster are spaced apart at a column die interconnect pitch along a second axis in a direction orthogonal to the first axis direction.

5. The IC die of clause 3 or clause 4, wherein the first axis is parallel to an edge of the substrate.

6. The IC die of any of clauses 3 to 5, wherein the second die interconnect in the first die interconnect row of the plurality of first die interconnect rows in the first die interconnect column cluster adjacent to the first die interconnect in the second die interconnect row of the plurality of second die interconnect rows in the second die interconnect column cluster is a next closest die interconnect to the first die interconnect in the second die interconnect row of the plurality of second die interconnect rows in the second die interconnect column cluster in the first axis direction.

7. The IC die of any of clauses 3 to 6, further comprising a third die interconnect column cluster, comprising a plurality of third die interconnect rows each comprising a first die interconnect spaced apart from a second die interconnect at the row die interconnect pitch, wherein a third die interconnect row of the plurality of third die interconnect rows in the third die interconnect column cluster are spaced apart along the first axis.

8. The IC die of clause 1, wherein:
   the substrate comprises a circuit layer; and
   the first die interconnect and the second die interconnect in each first die interconnect row of the plurality of first die interconnect rows and each second die interconnect row of the plurality of second die interconnect rows are configured to couple the circuit layer to an external circuit.

9. An integrated circuit (IC) package comprising:
   a first IC; and
   a second IC;
   wherein:
      each of the first IC and the second IC further comprises:
         a first die interconnect column cluster, comprising:
            a plurality of first die interconnect rows each comprising a first die interconnect spaced apart from a second die interconnect at a row die interconnect pitch; and
         a second die interconnect column cluster, comprising:
            a plurality of second die interconnect rows each comprising a first die interconnect spaced apart from a second die interconnect at the row die interconnect pitch; and
         the second die interconnect in each first die interconnect row of the plurality of first die interconnect rows is adjacent to the first die interconnect in a second die interconnect row of the plurality of second die interconnect rows and is spaced apart from the first die interconnect in the second die interconnect row of the plurality of second die interconnect rows by a column cluster pitch greater than the row die interconnect pitch.

10. The IC package of clause 9, wherein the column cluster pitch between the second die interconnects in the plurality of first die interconnect rows in the first die interconnect column cluster and the first die interconnects in the plurality of second die interconnect rows in the second die interconnect column cluster depends on a number of the plurality of first die interconnect rows in the first die interconnect column cluster and a number of the plurality of second die interconnect rows in the second die interconnect column cluster.

11. The IC package of clause 9 or clause 10, further comprising:
a first plurality of die-to-die (D2D) interconnects disposed in a conductive layer; and
a second plurality of D2D interconnects disposed in the conductive layer;
wherein:
the first plurality of D2D interconnects couple the first die interconnects in the plurality of first die interconnect rows in the first die interconnect column cluster of the first IC to the first die interconnects in the plurality of first die interconnect rows in the first die interconnect column cluster of the second IC; and
the second plurality of D2D interconnects couple the second die interconnects in the plurality of first die interconnect rows in the first die interconnect column cluster of the first IC to the second die interconnects in the plurality of first die interconnect rows in the first die interconnect column cluster of the second IC.

12. The IC package of clause 11, wherein a first one of the first plurality of D2D interconnects and a first one of the second plurality of D2D interconnects are disposed between the first die interconnects of the plurality of first die interconnect rows and the second die interconnects of the plurality of first die interconnect rows in the first die interconnect column cluster.

13. The IC package of clause 12, wherein:
the second die interconnects of the plurality of first die interconnect rows in the first die interconnect column cluster of the first IC are spaced apart at a column die interconnect pitch along a column axis; and
the second die interconnects of the plurality of first die interconnect rows in the first die interconnect column cluster of the second IC are spaced apart at the column die interconnect pitch along the column axis.

14. The IC package of clause 13, wherein a second one of the second plurality of D2D interconnects in the conductive layer extends along the column axis.

15. The IC package of any of clauses 11 to 13, further comprising a third plurality D2D interconnects disposed in the conductive layer, wherein the third plurality of D2D interconnects couple the first die interconnects in the plurality of second die interconnect rows in the second die interconnect column cluster of the first IC to the first die interconnects in the plurality of second die interconnect rows in the second die interconnect column cluster of the second IC.

16. The IC package of clause 14, wherein the second plurality of D2D interconnects, other than the first one of the second plurality of D2D interconnects and the second one of the second plurality of D2D interconnects, are disposed between the second die interconnects in the plurality of first die interconnect rows in the first die interconnect column cluster and the first die interconnects in the plurality of second die interconnect rows in the second die interconnect column cluster.

17. The IC package of clause 15, wherein all but two of the second plurality of D2D interconnects and all but two of the third plurality of D2D interconnects are disposed between the second die interconnects in the plurality of first die interconnect rows in the first die interconnect column cluster and the first die interconnects in the plurality of second die interconnect rows in the second die interconnect column cluster.

18. The IC package of clause 15 or clause 17, wherein:
the second plurality of D2D interconnects comprises a number M of D2D interconnects;
the third plurality of D2D interconnects comprises a number N of D2D interconnects; and
M−2 of the second plurality of D2D interconnects and N−2 of the third plurality of D2D interconnects are disposed between the second die interconnects of the plurality of first die interconnect rows in the first die interconnect column cluster and the first die interconnects of the plurality of second die interconnect rows in the second die interconnect column cluster.

19. The IC package of clause 18, wherein the column cluster pitch is at least ((M−2)+(N−2)) times a D2D interconnect pitch of the D2D interconnects.

20. The IC package of any of clauses 11 to 19, further comprising a package substrate comprising the conductive layer;
wherein the first IC and the second IC are disposed on the package substrate.

21. The IC package of clause 20, further comprising an insulating layer disposed over the first IC and second IC; wherein the conductive layer is disposed on the first and second die interconnects and on the insulating layer.

22. The IC package of clause 9, wherein:
the first IC die further comprises a first circuit layer;
the second IC die further comprises a second circuit layer; and
the first die interconnect and the second die interconnect in a first die interconnect row of the plurality of first die interconnect rows in the first IC die are coupled to the first die interconnect and the second die interconnect in a first die interconnect row of the plurality of first die interconnect rows in the second IC die to couple the first circuit layer to the second circuit layer.

23. The IC package of any of clauses 9 to 22, integrated into a radio-frequency (RF) front end module.

24. The IC package of any of clauses 9 to 23 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

What is claimed is:
1. An integrated circuit (IC) package, comprising:
a package substrate comprising first contacts and second contacts;
a first IC; and
a second IC;

wherein:
each of the first IC and the second IC further comprises:
a first die interconnect column cluster, comprising:
a plurality of first die interconnect rows, each comprising a first die interconnect spaced apart in a first direction from a second die interconnect at a row die interconnect pitch; and
a second die interconnect column cluster, comprising:
a plurality of second die interconnect rows, each comprising a first die interconnect spaced apart in the first direction from a second die interconnect at the row die interconnect pitch;
the second die interconnect in each first die interconnect row of the plurality of first die interconnect rows is spaced apart in the first direction from the first die interconnect in the second die interconnect row of the plurality of second die interconnect rows by a column cluster pitch greater than the row die interconnect pitch;
the first contacts are disposed opposite to and coupled to the first die interconnect and the second die interconnect in each of the first die interconnect rows in the first column cluster in the first IC; and
the second contacts are disposed opposite to and coupled to the first die interconnect and the second die interconnect in each of the first die interconnect rows in the first column cluster in the second IC.

2. The IC package of claim 1, wherein the column cluster pitch between the second die interconnects in the plurality of first die interconnect rows in the first die interconnect column cluster and the first die interconnects in the plurality of second die interconnect rows in the second die interconnect column cluster corresponds to a number of the plurality of first die interconnect rows in the first die interconnect column cluster and a number of the plurality of second die interconnect rows in the second die interconnect column cluster.

3. The IC package of claim 1, further comprising:
a first plurality of die-to-die (D2D) interconnects disposed in a conductive layer of the package substrate; and
a second plurality of D2D interconnects disposed in the conductive layer;
wherein:
the first plurality of D2D interconnects couple the first die interconnects in the plurality of first die interconnect rows in the first die interconnect column cluster of the first IC to the first die interconnects in the plurality of first die interconnect rows in the first die interconnect column cluster of the second IC; and
the second plurality of D2D interconnects couple the second die interconnects in the plurality of first die interconnect rows in the first die interconnect column cluster of the first IC to the second die interconnects in the plurality of first die interconnect rows in the first die interconnect column cluster of the second IC.

4. The IC package of claim 3, wherein the first plurality of D2D interconnects and the second plurality of D2D interconnects extend between the first IC and the second IC in a second direction orthogonal to the first direction.

5. The IC package of claim 4, wherein:
the first die interconnect rows of the plurality of first die interconnect rows in the first die interconnect column cluster of the first IC are spaced apart in the second direction at a column die interconnect pitch; and
the first die interconnect rows of the plurality of first die interconnect rows in the first die interconnect column cluster of the second IC are spaced apart in the second direction at the column die interconnect pitch.

6. The IC package of claim 5, wherein:
one of the first die interconnects in one of the plurality of first die interconnect rows in the first die interconnect column cluster of the first IC and one of the first die interconnects in one of the plurality of first die interconnect rows in the first die interconnect column cluster of the second IC are disposed along a column axis and are coupled by one of the first D2D interconnects of the first plurality of D2D interconnects extending along the column axis.

7. The IC package of claim 3, further comprising a third plurality D2D interconnects disposed in the conductive layer, wherein the third plurality of D2D interconnects couple the first die interconnects in the plurality of second die interconnect rows in the second die interconnect column cluster of the first IC to the first die interconnects in the plurality of second die interconnect rows in the second die interconnect column cluster of the second IC.

8. The IC package of claim 3, wherein one of the first plurality of D2D interconnects and one of the second plurality of D2D interconnects are disposed on the package substrate between the first die interconnects and the second die interconnects in the plurality of first die interconnect rows in the first die interconnect column cluster on the first IC.

9. The IC package of claim 1, wherein:
the first IC die further comprises a first circuit layer;
the second IC die further comprises a second circuit layer; and
the first die interconnect and the second die interconnect in a first die interconnect row of the plurality of first die interconnect rows in the first IC die are coupled to the first die interconnect and the second die interconnect in a first die interconnect row of the plurality of first die interconnect rows in the second IC die to couple the first circuit layer to the second circuit layer.

10. The IC package of claim 1, integrated into a radio-frequency (RF) front end module.

11. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. A package substrate comprising:
a plurality of first contact rows each comprising a first contact spaced apart in a first direction from a second contact at a row contact pitch; and
a plurality of second contact rows each comprising a first contact spaced apart in the first direction from a second contact at the row contact pitch;
wherein the second contact in each first contact row of the plurality of first contact rows is spaced apart in the first direction from the first contact in a second contact row of the plurality of second contact rows by a column cluster pitch greater than the row contact pitch;
a plurality of third contact rows each comprising a first contact spaced apart in the first direction from a second contact at the row contact pitch; and
a plurality of fourth contact rows each comprising a first contact spaced apart in the first direction from a second contact at the row contact pitch;
wherein the second contact in each third contact row of the plurality of third contact rows is spaced apart in the first direction from the first contact in a fourth contact row of the plurality of fourth contact rows by the column cluster pitch; and
a conductive layer, comprising:
a first plurality of die-to-die (D2D) interconnects each coupled to a first contact in one of the plurality of first contact rows and coupled to a first contact in one of the plurality of third contact rows; and
a second plurality of D2D interconnects each coupled to a first contact in one of the plurality of second contact rows and coupled to a first contact in one of the plurality of fourth contact rows.

13. The package substrate of claim 12, further comprising:
a third plurality of D2D interconnects each coupled to a second contact in one of the plurality of first contact rows and coupled to a second contact in one of the plurality of third contact rows; and
a fourth plurality of D2D interconnects each coupled to a second contact in one of the plurality of second contact rows and coupled to a second contact in one of the plurality of fourth contact rows.

14. The package substrate of claim 13, wherein:
the second plurality of D2D interconnects is between the first plurality of D2D interconnects and the third plurality of D2D interconnects in the first direction; and
the third plurality of D2D interconnects is between the second plurality of D2D interconnects and the fourth plurality of D2D interconnects in the first direction.

15. The package substrate of claim 12, wherein:
the plurality of first contact rows comprises at least three (3) first contact rows; and
the plurality of third contact rows comprises at least three (3) third contact rows.

16. The package substrate of claim 12, wherein a first contact row of the plurality of first contact rows and a second contact row of the plurality of second contact rows are spaced apart along a second direction orthogonal to the first direction.

17. The package substrate of claim 16, wherein the first plurality of D2D interconnects extends from the plurality of first contact rows to the plurality of third contact rows in the second direction.

18. The package substrate of claim 17, wherein:
the plurality of first contact rows and the plurality of second contact rows are configured to couple to corresponding die interconnects on a first integrated circuit (IC); and
the plurality of third contact rows and the plurality of fourth contact rows are configured to couple to corresponding die interconnects on a second IC.

19. An integrated circuit (IC) package comprising:
a first IC;
a second IC;
a first plurality of die-to-die (D2D) interconnects disposed in a conductive layer;
a second plurality of D2D interconnects disposed in the conductive layer; and
a third plurality of D2D interconnects disposed in the conductive layer,
wherein:
each of the first IC and the second IC further comprises:
a first die interconnect column cluster, comprising:
a plurality of first die interconnect rows each comprising a first die interconnect spaced apart from a second die interconnect at a row die interconnect pitch; and
a second die interconnect column cluster, comprising:
a plurality of second die interconnect rows each comprising a first die interconnect spaced apart from a second die interconnect at the row die interconnect pitch;
the second die interconnect in each first die interconnect row of the plurality of first die interconnect rows is spaced apart from the first die interconnect in the second die interconnect row of the plurality of second die interconnect rows by a column cluster pitch greater than the row die interconnect pitch;
the first plurality of D2D interconnects couple the first die interconnects in the plurality of first die interconnect rows in the first die interconnect column cluster of the first IC to the first die interconnects in the plurality of first die interconnect rows in the first die interconnect column cluster of the second IC;
the second plurality of D2D interconnects couple the second die interconnects in the plurality of first die interconnect rows in the first die interconnect column cluster of the first IC to the second die interconnects in the plurality of first die interconnect rows in the first die interconnect column cluster of the second IC; and
the third plurality of D2D interconnects couple the first die interconnects in the plurality of second die interconnect rows in the second die interconnect column cluster of the first IC to the first die interconnects in the plurality of second die interconnect rows in the second die interconnect column cluster of the second IC.

20. The IC package of claim 19, wherein:
a first one of the first plurality of D2D interconnects and a first one of the second plurality of D2D interconnects are disposed between the first die interconnects of the plurality of first die interconnect rows and the second die interconnects of the plurality of first die interconnect rows in the first die interconnect column cluster;
a second one of the second plurality of D2D interconnects in the conductive layer extends along the column axis; and
the second plurality of D2D interconnects, other than the first one of the second plurality of D2D interconnects and the second one of the second plurality of D2D interconnects, are disposed between the second die interconnects in the plurality of first die interconnect rows in the first die interconnect column cluster and the first die interconnects in the plurality of second die interconnect rows in the second die interconnect column cluster.

21. The IC package of claim 19, wherein all but two of the second plurality of D2D interconnects and all but two of the third plurality of D2D interconnects are disposed between the second die interconnects in the plurality of first die interconnect rows in the first die interconnect column cluster and the first die interconnects in the plurality of second die interconnect rows in the second die interconnect column cluster.

22. The IC package of claim 19, wherein:
the second plurality of D2D interconnects comprises a number M of D2D interconnects;
the third plurality of D2D interconnects comprises a number N of D2D interconnects; and
M−2 of the second plurality of D2D interconnects and N−2 of the third plurality of D2D interconnects are disposed between the second die interconnects of the plurality of first die interconnect rows in the first die interconnect column cluster and the first die interconnects of the plurality of second die interconnect rows in the second die interconnect column cluster.

23. The IC package of claim 22, wherein the column cluster pitch is at least ((M−2)+(N−2)) times a D2D interconnect pitch.

* * * * *